United States Patent
Kreuzer

(10) Patent No.: US 7,511,826 B2
(45) Date of Patent: Mar. 31, 2009

(54) SYMMETRICAL ILLUMINATION FORMING SYSTEM AND METHOD

(75) Inventor: Justin L. Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 409 days.

(21) Appl. No.: 11/361,988

(22) Filed: Feb. 27, 2006

(65) Prior Publication Data

US 2007/0201034 A1 Aug. 30, 2007

(51) Int. Cl.
G01B 11/02 (2006.01)
G01B 9/02 (2006.01)

(52) U.S. Cl. ..................... 356/509; 356/520

(58) Field of Classification Search ............ 356/487, 356/493, 508–510, 491, 492, 494, 520
See application file for complete search history.

(56) References Cited

U.S. PATENT DOCUMENTS

| | | | |
|---|---|---|---|
| 3,945,713 A | 3/1976 | Doi et al. | |
| 4,335,313 A | 6/1982 | Kreuzer et al. | |
| 4,340,305 A | 7/1982 | Smith et al. | |
| 4,504,148 A | 3/1985 | Kuroki et al. | |
| 4,545,683 A | 10/1985 | Markle | |
| 4,549,084 A | 10/1985 | Markle | |
| 4,578,590 A | 3/1986 | Wu | |
| 4,579,453 A | 4/1986 | Makita | |
| 4,645,346 A * | 2/1987 | Fontanella | 356/520 |
| 4,697,087 A | 9/1987 | Wu | |
| 4,758,976 A | 7/1988 | Cohen | |
| 5,157,459 A * | 10/1992 | Oono et al. | 356/520 |
| 5,477,057 A * | 12/1995 | Angeley et al. | 250/548 |
| 5,559,601 A | 9/1996 | Gallatin et al. | |
| 5,767,523 A | 6/1998 | McCullough | |
| 5,943,135 A | 8/1999 | Mishima et al. | |
| 6,034,378 A | 3/2000 | Shiraishi | |
| 6,100,980 A | 8/2000 | Ichikawa | |
| 6,242,754 B1 | 6/2001 | Shiraishi | |

(Continued)

OTHER PUBLICATIONS

Thorlabs, Inc. Operations Manual: Soleil Babinet Compensator Models: SBC-VIS, SBC-UV, SBC-IR, Version 1.4, Newton, NJ, Oct. 28, 2002.*

(Continued)

*Primary Examiner*—Patrick J Connolly
*Assistant Examiner*—Scott M Richey
(74) *Attorney, Agent, or Firm*—Sterne, Kessler, Golstein & Fox P.L.L.C.

(57) ABSTRACT

An embodiment of a symmetry forming device for an alignment system can include an interferometer, a compensator, and an analyzer. The interferometer can be configured to receive a light beam, where the light beam can be produced from a light source or from combining beams from a plurality of light sources. Further, the interferometer can be configured to split the light beam into two beams, rotate one beam 180 degrees with respect to the other beam about an axis of rotation, and recombine the two beams to form a recombined beam. The compensator can be configured to adjust a path length of either the combined or the recombined beam in first and second polarization directions to form an adjusted light beam. The analyzer can be configured to pass a polarization direction or an amplitude and phase profile of either the recombined or adjusted light beam, where the recombined or adjusted light beam is directed onto a substrate.

20 Claims, 5 Drawing Sheets

U.S. PATENT DOCUMENTS

| | | | | |
|---|---|---|---|---|
| 6,628,406 B1* | 9/2003 | Kreuzer | | 356/508 |
| 6,809,827 B2* | 10/2004 | Kreuzer | | 356/508 |
| 6,819,434 B2* | 11/2004 | Hill | | 356/509 |
| 6,965,436 B2* | 11/2005 | Latypov et al. | | 356/520 |
| 7,084,987 B2* | 8/2006 | Kreuzer | | 356/508 |
| 7,130,057 B2* | 10/2006 | Brasen et al. | | 356/501 |
| 7,158,238 B2* | 1/2007 | Latypov et al. | | 356/520 |
| 7,193,726 B2* | 3/2007 | Hill | | 356/520 |
| 7,310,152 B2* | 12/2007 | Carlson | | 356/493 |
| 7,362,446 B2* | 4/2008 | Van Der Pasch et al. | | 356/499 |
| 2005/0041256 A1* | 2/2005 | Kreuzer | | 356/508 |
| 2007/0153348 A1* | 7/2007 | Roux et al. | | 359/196 |

OTHER PUBLICATIONS

De Nicola, S. et al., "Reflective grating interferometer: a folded reversal wave-front interferometer," *Applied Optics*, vol. 38, No. 22, pp. 4845-4849 (Aug. 1, 1999).

Omatsu, T. et al. "Time-resolved measurement of spatial coherence of a copper vapor laser beam using a reversal shear interferometer," *Optics Communications*, vol. 87, No. 5/6, pp. 278-286 (Feb. 15, 1992).

English Abstract of Japanese Patent Publication No. 03130638, published Jun. 4, 1991, 1 page.

* cited by examiner

SYMMETRICAL ILLUMINATION FORMING SYSTEM AND METHOD

BACKGROUND

1. Field of the Invention

The present invention relates to illumination optical systems, for example illumination optical systems that are used to form alignment system illumination beams in lithography.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., photo resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers half of the width of the substrate, for example, then the substrate can be moved transversely after the first scan, and a further scan is typically performed to expose the remainder of the substrate.

It has become very important with the decrease in feature size to accurately align substrates before each exposure. An alignment illumination beam of radiation can be formed from multiple wavelengths of light that are combined together. For example, the light can be from four different optical fibers coupled to four light sources each producing a different wavelength of light. The four light beams are combined using an optical multiplexer. However, this combined light may not have a desired optical symmetry in order to produce the best alignment illumination beam for alignment operations. In particular, it is desired to have alignment illumination beam having 180 degree phase and amplitude symmetry to a very high tolerance. This can be difficult to achieve with the multiplexer because the combined beam formed by the multiplexer typically includes excessive high spatial frequency amplitude and phase variations and ripples, among other problems. These types of defects in an alignment illumination beam can limit 0-order extinction ratio, which can affect the ability to detect weak or shallow alignment marks on a substrate with the alignment illumination beam.

What is needed is a system and method that produces an alignment system illumination beam having 180 degree symmetry.

SUMMARY

In an embodiment of the present invention, there is provided a system comprising an interferometer, a compensator, and an analyzer. The interferometer is configured to: (a) receive a light beam, the light beam being produced from a light source or from combining beams from a plurality of light sources; (b) split the received light beam into first an second beams; (c) rotate the first beam with respect to the second beam about an axis of rotation, such that the first and second beams have 180 degree symmetry about the axis of rotation; and (d) recombine the first and second beams to form a recombined beam. The compensator adjusts path lengths of either the light beam or the recombined beam in first and second polarization directions to form an adjusted light beam. Accordingly, the path lengths in each of the first and second polarization directions can be made substantially equal. The analyzer passes one polarization direction of the recombined light beam, the portion of the light field with 180 degree amplitude and phase symmetry, and rejects the other polarization direction, the portion without the 180 degree symmetry.

In an example, the combined light beam is formed from a combiner or multiplexer from multiple light beams generated by multiple light sources. The light beams may have different wavelengths of light. Alternatively, the combined light beam is spatially filtered. In another example, the light beam transmitted from the analyzer impinges on an alignment mark of a substrate and is detected by a detection system, such that the substrate is aligned for exposure by an alignment system based on the detection.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
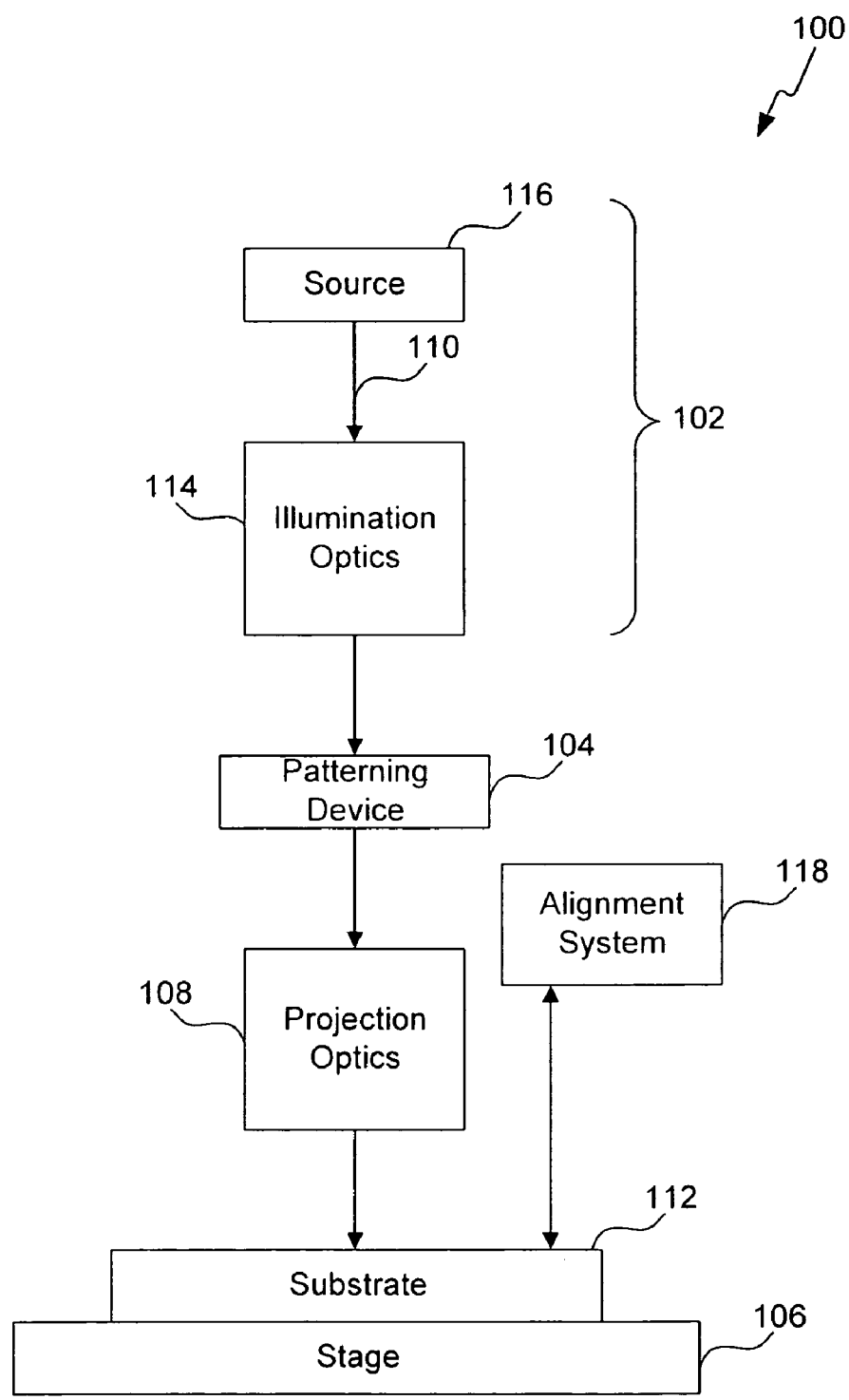
FIG. 1 depicts a lithographic apparatus, according to one embodiment of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

Overview

In one or more embodiments, a system and method are used to form alignment system illumination light beams having, for example, desirable phase and amplitude symmetry. This is produced using a symmetry forming device, located within the alignment system, having at least a compensator, an interferometer, and an analyzer.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Exemplary Lithography Apparatus

FIG. 1 shows a lithographic apparatus 100, according to one embodiment of the present invention. Apparatus 100 comprises an illumination system 102, a patterning device 104, a substrate table 106, a projection system 108, and an alignment system 118.

The illumination system 102 is configured to condition a radiation beam 110.

The patterning device 104 (e.g., a reticle or mask, or one or more arrays of individually controllable elements) modulates the beam 110. In general, the position of the patterning device 104 will be fixed relative to the projection system 108. However, it can instead be connected to a positioner configured to accurately position the array of individually controllable elements in accordance with certain parameters.

The substrate table 106 is constructed to support a substrate (e.g., a resist-coated substrate, such as a wafer or a flat panel display) 112 and connected to a positioner (not shown) configured to accurately position the substrate in accordance with certain parameters.

The projection system (e.g., a refractive projection lens system, a reflective system, or combinations thereof) 108 is configured to project the beam of radiation modulated by the patterning device 104 onto a target portion (e.g., comprising one or more dies) of the substrate 112.

The alignment system 118 can use alignment illumination to detect an alignment mark on substrate 112. This detection process can be used to generate a control signal, which is used to adjust a position of substrate table 106 to properly position substrate 112 to exposure a pattern on substrate 112.

The illumination system 102 can include illumination optics 114 having various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam 110 may not exactly correspond to the desired pattern in the target portion of the substrate 112, for example, if the pattern includes phase-shifting features or so called assist features. Similarly, the pattern eventually generated on the substrate 112 may not correspond to the pattern formed at any one instant on the array of individually controllable elements 104. This can be the case in an arrangement in which the eventual pattern formed on each part of the substrate 112 is built up over a given period of time or a given number of exposures during which the pattern on the array of individually controllable elements 104 and/or the relative position of the substrate 112 changes.

Generally, the pattern created on the target portion of the substrate 112 will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices 104 whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam 110 becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example patterning device 104 is a programmable LCD array.

The lithographic apparatus 100 can comprise one or more contrast devices 104. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate 112 has a substantially circular shape, optionally with a notch and/or a flattened edge along part of its perimeter. In another example, the substrate 112 has a polygonal shape, e.g., a rectangular shape.

In an example where the substrate 112 has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate 112 is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate 112 has a length of at most 1000 cm, e.g., at most 750 cm, at most 500 cm, at most 350 cm, at most 250 cm, at most 150 cm, or at most 75 cm.

In one example, the substrate 112 is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate 112 is a ceramic substrate. In one example, the substrate 112 is a glass substrate. In one example, the substrate is a plastic substrate. In one example, the substrate 112 is transparent (for the naked human eye). In one example, the substrate 112 is colored. In one example, the substrate 112 is absent a color.

The thickness of the substrate 112 can vary and, to an extent, can depend, e.g., on the substrate material and/or the substrate dimensions. In one example, the thickness is at least 50 μm, e.g., at least 100 μm, at least 200 μm, at least 300 μm, at least 400 μm, at least 500 μm, or at least 600 μm. In one example, the thickness of the substrate is at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate 112 referred to herein can be processed, before or after exposure, in for example a track (a tool that typically applies a layer of resist to a substrate 112 and develops the exposed resist), a metrology tool, and/or an inspection tool. In one example, a resist layer is provided on the substrate 112.

The term "projection system" 108 used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system 108 can image the pattern on the array of individually controllable elements 104, such that the pattern is coherently formed on the substrate 112. Alternatively, the projection system 108 can image secondary sources for which the elements of the array of individually controllable elements act as shutters. In this respect, the projection system 108 can comprise an array of focusing elements, such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device 104 is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements 104, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

As herein depicted in FIG. 1, the apparatus 104 is of a transmissive type (e.g., employing a transmissive array of individually controllable elements). Alternatively, the apparatus 104 can be of a reflective type (e.g., employing a reflective array of individually controllable elements).

The lithographic apparatus 100 can be of a type having two (dual stage) or more substrate tables 106. In such "multiple stage" machines, the additional tables 106 can be used in parallel, or preparatory steps can be carried out on one or more tables 106 while one or more other tables 106 are being used for exposure.

The lithographic apparatus 100 can also be of a type wherein at least a portion of the substrate 112 can be covered by an "immersion liquid" having a relatively high refractive index, e.g., water, so as to fill a space between the projection system and the substrate. An immersion liquid can also be applied to other spaces in the lithographic apparatus 100, for example, between the patterning device 104 and the projection system 108. Immersion techniques are well known in the art for increasing the numerical aperture of projection systems. The term "immersion" as used herein does not mean that a structure, such as a substrate 112, must be submerged in liquid, but rather only means that liquid is located between the projection system 108 and the substrate 112 during exposure.

Referring again to FIG. 1, the illuminator 114 receives a radiation beam 110 from a radiation source 116. In one example, the radiation source 116 provides radiation 110 having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation 110 provided by radiation source 116 has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation 110 has a wavelength including 436 nm, 405 nm, 365 nm, 355 nm, 248 nm, 193 nm, 157 nm, and/or 126 nm. In one example, the radiation 110 includes a wavelength of around 365 nm or around 355 nm. In one example, the radiation 110 includes a broad band of wavelengths, for example encompassing 365, 405, and 436 nm. A 355 nm laser source could be used.

The source 116 and the lithographic apparatus 100 can be separate entities, for example when the source is an excimer laser. In such cases, the source 116 is not considered to form part of the lithographic apparatus 100 and the radiation beam 110 is passed from the source 116 to the illuminator 114 with the aid of a beam delivery system (not shown) comprising, for example, suitable directing mirrors and/or a beam expander. In other cases the source can be an integral part of the lithographic apparatus, for example when the source is a mercury lamp. The source 116 and the illuminator 114, together with the beam delivery system if required, can be referred to as a radiation system.

The illuminator 114, can comprise an adjuster for adjusting the angular intensity distribution of the radiation beam 110. Generally, at least the outer and/or inner radial extent (commonly referred to as σ-outer and σ-inner, respectively) of the intensity distribution in a pupil plane of the illuminator 114 can be adjusted. In addition, the illuminator 114 can comprise various other components, such as an integrator and a condenser. The illuminator 114 can be used to condition the radiation beam 110 to have a desired uniformity and intensity distribution in its cross-section. The illuminator 114, or an additional component associated with it, can also be arranged to divide the radiation beam 110 into a plurality of sub-beams that can, for example, each be associated with one or a plurality of the individually controllable elements of the array of individually controllable elements 104. A two-dimensional diffraction grating can, for example, be used to divide the radiation beam 110 into sub-beams. In the present description, the terms "beam of radiation" and "radiation beam" encompass, but are not limited to, the situation in which the beam is comprised of a plurality of such sub-beams of radiation.

The radiation beam 110 is incident on the patterning device 104 (e.g., an array of individually controllable elements) and is modulated by the patterning device 104. Having been reflected by the patterning device 104, the radiation beam 110 passes through the projection system 108, which focuses the beam onto a target portion of the substrate 112. With the aid of the positioner and an alignment system 118 (e.g., a wafer pattern position sensor, an interferometric device, linear encoder, capacitive sensor, or the like), the substrate table 106 can be moved accurately, e.g., so as to position different target portions in the path of the radiation beam 110. Where used, the positioning means for the array of individually controllable elements 104 can be used to correct accurately the position of the patterning device 104 with respect to the path of the beam 110, e.g., during a scan.

In one example, movement of the substrate table 106 is realized with the aid of a long-stroke module (course positioning) and a short-stroke module (fine positioning), which are not explicitly depicted in FIG. 1. In one example, the apparatus is absent at least a short stroke module for moving substrate table 106. A similar system can also be used to position the array of individually controllable elements 104. It will be appreciated that the beam 110 can alternatively/additionally be moveable, while the object table and/or the array of individually controllable elements can have a fixed position to provide the required relative movement. Such an arrangement can assist in limiting the size of the apparatus 100.

As a further alternative, which can, e.g., be applicable in the manufacture of flat panel displays, the position of the substrate table 106 and the projection system 108 can be fixed and the substrate W can be arranged to be moved relative to the substrate table 106. For example, the substrate table 106 can be provided with a system for scanning the substrate 112 across it at a substantially constant velocity.

The depicted apparatus can be used in several modes:

1. In step mode, the array of individually controllable elements and the substrate are kept essentially stationary, while an entire pattern imparted to the radiation beam is projected onto a target portion at one go (i.e., a single static exposure). The substrate table is then shifted in the X and/or Y direction so that a different target portion can be exposed. In step mode, the maximum size of the exposure field limits the size of the target portion imaged in a single static exposure.

2. In scan mode, the array of individually controllable elements and the substrate are scanned synchronously while a pattern imparted to the radiation beam is projected onto a target portion (i.e., a single dynamic exposure). The velocity and direction of the substrate relative to the array of individually controllable elements can be determined by the (de-)magnification and image reversal characteristics of the projection system. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion of the substrate using a pulsed radiation source. The substrate table is moved with an essentially constant speed such that the beam is caused to scan a line across the substrate. The pattern on the array of individually controllable elements is updated as required between pulses of the radiation system and the pulses are timed such that successive target portions are exposed at the required locations on the substrate. Consequently, the beam can scan across the substrate to expose the complete pattern for a strip of the substrate. The process is repeated until the complete substrate W has been exposed line by line.

4. In continuous scan mode, essentially the same as pulse mode except that the substrate is scanned relative to the modulated beam of radiation at a substantially constant speed and the pattern on the array of individually controllable elements is updated as the beam scans across the substrate and exposes it. A substantially constant radiation source or a pulsed radiation source, synchronized to the updating of the pattern on the array of individually controllable elements, can be used.

5. In pixel grid imaging mode, the pattern formed on substrate is realized by subsequent exposure of spots formed by a spot generator that are directed onto patterning device. The exposed spots have substantially the same shape. On substrate the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

Exemplary Alignment System

Figure 2:
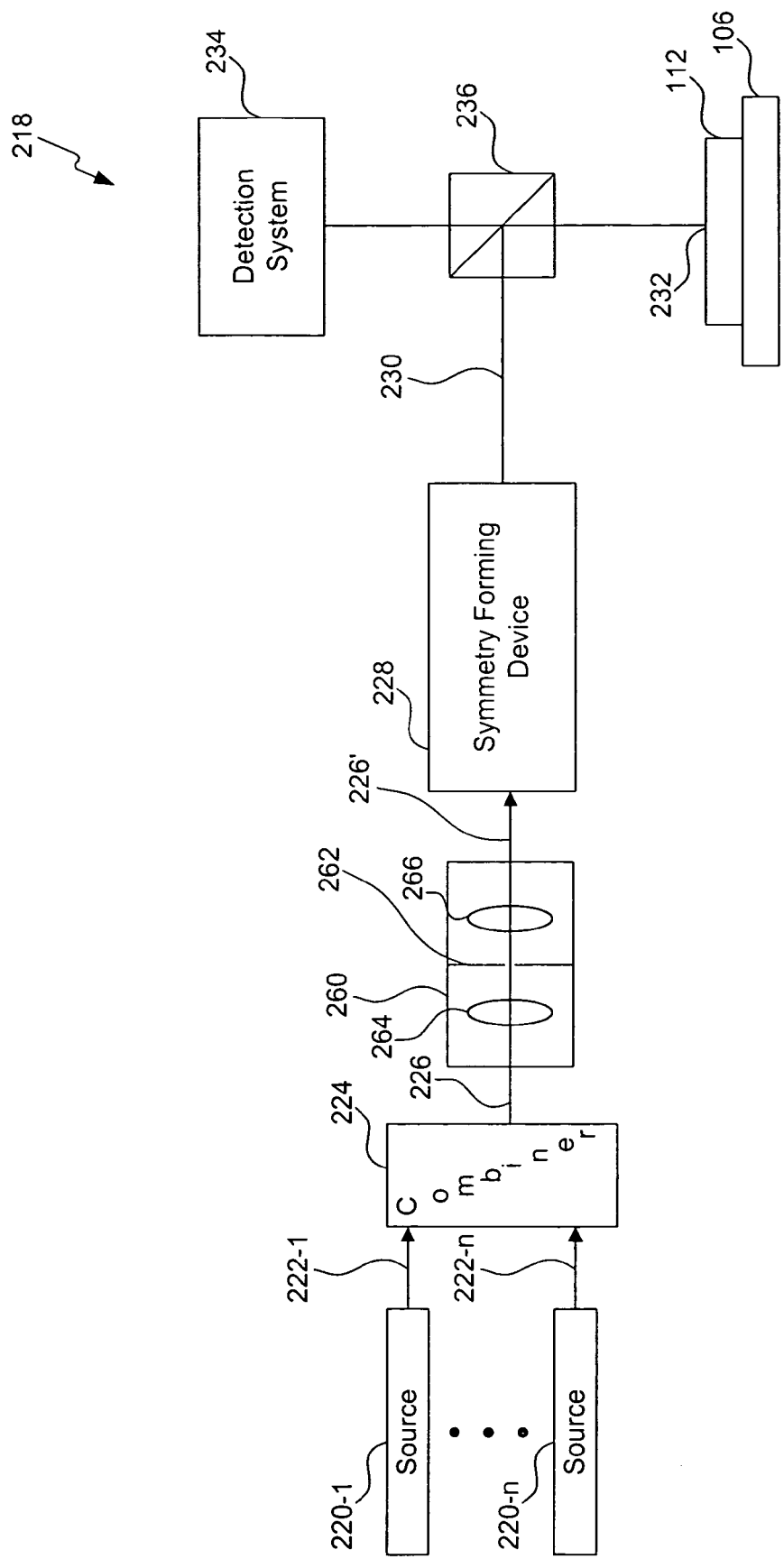
FIG. 2 shows an alignment system in the lithography apparatus, according to one embodiment of the present invention.

FIG. 2 shows an alignment system 218, according to an embodiment of the present invention. Alignment system 218 includes one or more light sources 220 that produce respective light beams 222, which can be received at a combiner 224. Combiner 224 combines the two or more light beams 222 to form a combined light beam 226. In one example, combiner 224 is an optical multiplexer (or an optical demultiplexer), which optically combines the plurality of received light beams 222. Combined beam 226 is received at a symmetry forming device 228, which process combined beam 226 to form a symmetrical beam 230. Symmetrical beam 230 (e.g., an alignment system illumination beam) is directed by a beam splitter 236 onto an alignment mark 232 on substrate 112, and then directed by beam splitter 236 onto a detection system 234. Detection system 234 analyzes the reflected beam and determines whether a position of substrate 112 needs to be adjusted to optimize alignment of substrate 112 with exposure beam 110.

In one example, a single light source 220 producing a single beam 222 an be used instead of a plurality of light sources.

Alternatively, alignment system 218 can include an optional spatial filter 260 positioned between combiner 224 and symmetry forming device 228. Spatial filter 260 is used to substantially reduce or eliminate any unwanted high spatial frequency light component of combined beam 226. For example, aperture 262 substantially eliminates high spatial frequency of stray light, which is characterized by light rays at large angles that will not pass through aperture 262. Accordingly, imperfections in combined light beam 226 can be substantially eliminated. In operation, combined beam 226 is directed onto aperture 262 using an optical device 264 (e.g., a lens). A spatially filtered combined beam 226' is directed onto symmetry forming system 228 from aperture 262 using optical device 266 (e.g., a lens).

Light sources 220-1 to 220-n (n being an integer greater than 1) can produce light beams 222-1 to 222-n having the same or different wavelengths.

Light beams 222-1 to 222-n can be delivered to combiner 224 using one or more fiber optical devices or waveguides (not shown), for example.

An alignment system similar to alignment system 218, except for at least symmetry forming device 228, can be found in co-owned U.S. Pat. Nos. 6,628,406 and 6,809,827 and co-owned U.S. application Ser. No. 10/959,511, which are all incorporated by reference herein in their entireties.

Exemplary Symmetry Forming Devices

Figure 3:
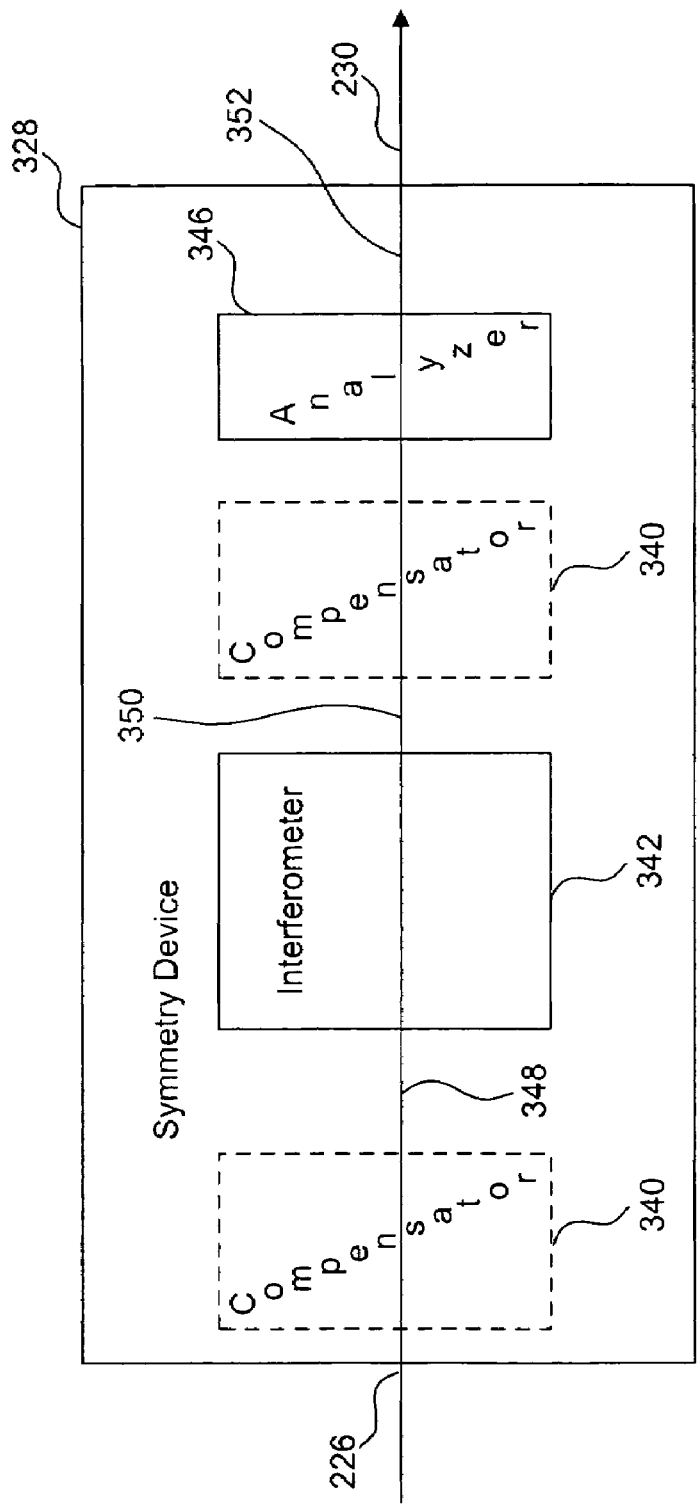
FIGS. 3 and 4 show symmetry forming systems in the alignment system, according to various embodiments of the present invention.
Figure 4:
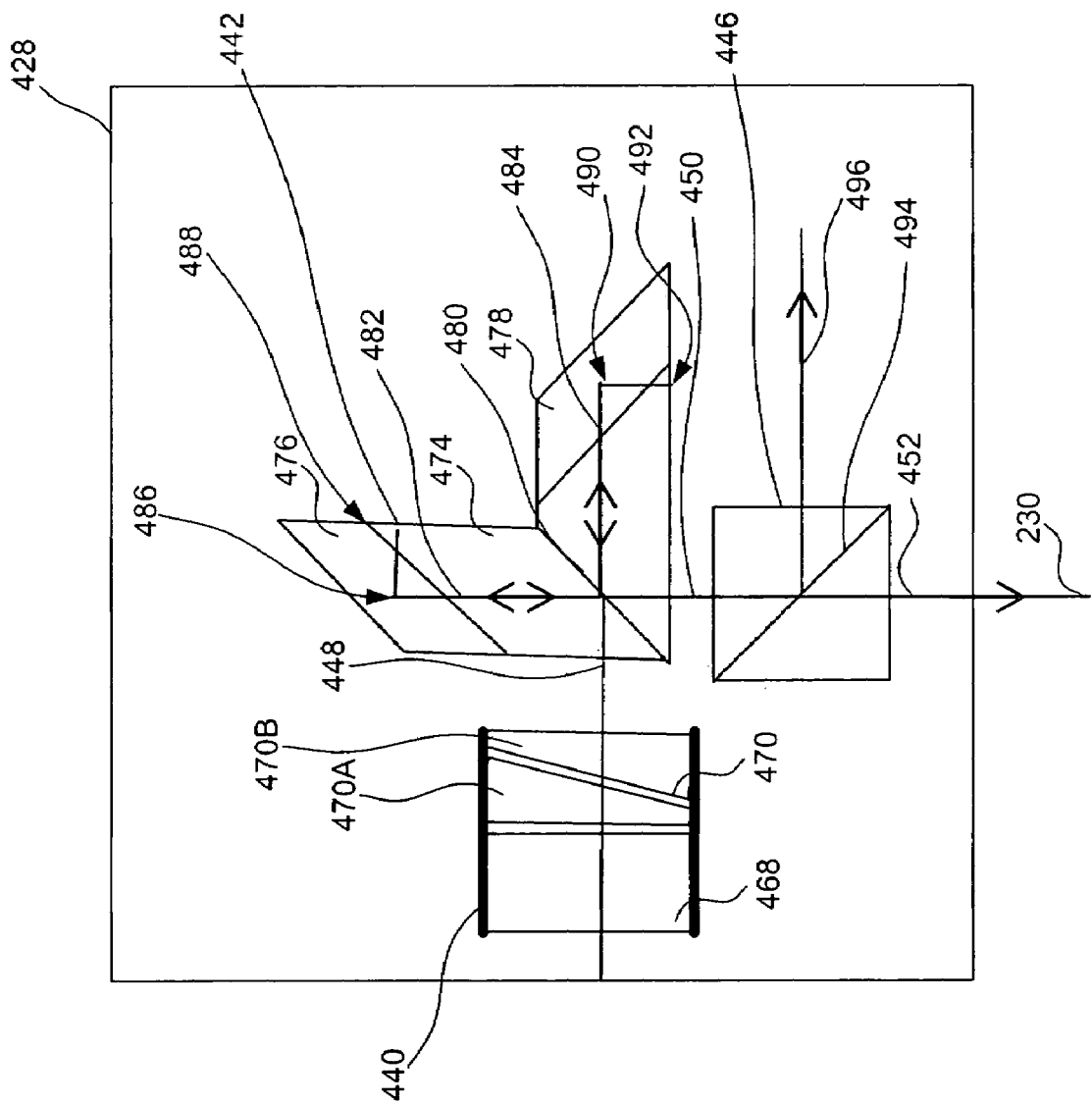

FIGS. 3 and 4 illustrate exemplary arrangements of symmetry forming device 228, according to various embodiments of the present invention.

In regards to FIG. 3, a symmetry forming device 328 includes a compensator 340, an interferometer 342, and an analyzer 346. In first and second alternative examples, compensator 340 can be placed either before or after interferometer 342, which is illustrated by the dashed lines. The following description will be in terms of compensator 340 being before interferometer 342, which is the first example.

In operation, an adjusted beam 348 is received by interferometer 342 from compensator 340. Interferometer 342 splits adjusted beam 348 into first and second beams (not shown), rotates the first and second beams 180 degrees with respect to each other, and recombines the rotated first and second beams to produce a recombined beam 350. Recombined beam 350 is received by analyzer 346. Analyzer 346 produces output beam 352 by only transmitting one polarization component of recombined beam 350.

The first and second beams in interferometer 342 can have opposite polarizations. For example, a first polarization direction (or orientation) can be horizontally polarized and the second polarization direction can be vertically polarized. In interferometer 342 the first beam is rotated positive 90 degrees and the second beam is rotated negative 90 degrees. Thus, interferometer 342 can be a 180 degree rotational interferometer. This refers to the fact that a recombined beam 350 includes first and second beams that were rotated 180 degrees with respect to each other.

In another example, analyzer 346 can transmit only portions of recombined beam 350 having an even profile. For example, energy in recombined beam 350 having an odd profile in amplitude and phase is "rejected" (e.g., reflected away from a main light path or absorbed), while energy in recombined beam 350 having an even profile in amplitude and phase is transmitted through analyzer 346.

In the first example, where compensator 340 is located before interferometer 342 in an optical light path, compensator 340 can be used to equalize path lengths of the first and second polarization directions of beam 226. This can be done so that the path lengths in both polarization directions are substantially equal. Also, an amount of adjustment of the path lengths can be based on the optical characteristics of interferometer 342. For example, when the first and second beams in interferometer 342 are formed based on their polarization, a determination can be made of a path length difference between the first and second paths through interferometer 342. This path length difference is then used to configure compensator 340, such that compensator 340 equalizes the path length between the two polarization directions by adjusting the path length of a beam through compensator 340 for one of the two polarization directions.

Thus, through use of symmetry forming device 328, a combined beam 226 can be processed using compensator 340, interferometer 342, and analyzer 346 to produce alignment system illumination beam 230 having the desired optical characteristics, such as 180 degree phase and amplitude symmetry.

With reference now to FIG. 4, a symmetry forming device 428 according to another embodiment of the present invention is shown. Device 428 includes compensator 440, an interferometer 442, and an analyzer 446.

Compensator 440 can comprise a Soleil Babinet compensator. As is known to a skilled artisan, a Soleil Babinet compensator includes a first portion 468 and a second portion 470, each allowing transmission of a different polarization component or polarization direction of combined beam 226'.

Thus, through having different polarization characteristics (e.g., birefringence characteristics), portions 468 and 470 transmit a first and second polarization direction of light with different phase delays Also, second portion 470 can be used to change a path length in one polarization component. This is based on second portion 470 being comprised of first and second wedges 470A and 470B. Wedge 470A is coupled to first portion 468, while wedge 470B moves vertically with respect to 470A (in the perspective of this figure). The movement allows for altering of a path length of light by making an overall configuration of portion 470 thicker or thinner depending on the relative positioning of first and second wedges 470A and 470B. Movement of second wedge 470B with respect to first wedge 470A permits the path length of the light to be adjusted to produce adjusted beam 448.

In one example, a path length difference between first and second light path through interferometer 442 is determined. The path length difference is used to adjust or position second wedge 470B with respect to first wedge 470A. Alternatively, this can be done either once after an initial determination of path length difference or multiple times after periodic determinations of path length difference.

Interferometer 442 can comprise a beam splitter 474 and first and second prisms 476 and 478. Beam splitter 474 is a polarizing beam splitter, for example, that splits adjusted light beam 448 into its first and second polarization components. At interface 480, adjusted beam 448 is split into first and second beams 482 and 484 (e.g., first and second polarization components). First beam 482 is reflected upward by interface 480, which can include a polarization based beamsplitter coating, to be reflected from facet 486 downward to base 488. Base 488 reflects first beam 482 back up to reflect off facet 486 and return to interface 480. Through this sequence, first beam 482 rotates positive 90 degrees with respect to its original orientation, and is transmitted through interface 480 towards analyzer 446. Similarly, second beam 484 is transmitted through interface 480 towards facet 490 and reflects downward from facet 490 to base 492. Base 492 reflects second beam 484 upward to be reflected off facet 490 and return to interface 480. Through this sequence, second beam 484 rotates negative 90 degrees, and is reflected by interface 480 towards analyzer 446.

After rotation, first and second beams 482 and 484 are recombined through interface 480 to form recombined beam 450. Through the rotation sequences discussed above, first and second beams 482 and 484 are rotated 180 degrees with respect to each other before they recombine at interface 480. For example, first beam 482 may be rotated positive 90 degrees, while second beam 484 may be rotated negative 90 degrees, so combined there is a 180 degree total rotation between first and second beams 482 and 484.

The functionality of a similar rotation interferometer, and alternative arrangements for rotation interferometers, is discussed in more detail in, for example, co-owned U.S. Pat. Nos. 6,628,406 and 6,809,827 and U.S. application Ser. No. 10/959,511, which are all incorporated by reference herein in their entireties.

In this embodiment, analyzer 446 is a polarization beam splitter. Recombined beam 450 includes both polarization directions or orientations of light. As recombined beam 450 impinges on interface or face 494 of beam splitter 446, light in a first polarization direction passes through interface 494, while light in a second polarization direction is reflected by interface 494. The light passing through interface 494 becomes the alignment illumination 452/230. This alignment illumination 230 now has, for example, 180 degree symmetry in amplitude and phase. The light reflecting from interface 494 becomes rejected light beam 496, and exits the symmetry forming system 428, away from the alignment illumination light path.

Alternatively, physically rotating of analyzer 446 90 degrees (not shown), such that interface 494 is from the bottom left corner to the top right corner of analyzer 446, can allow for changing of which polarization direction is transmitted to become beam 230 and which polarization direction is reflected as beam 496.

Exemplary Operation

Figure 5:
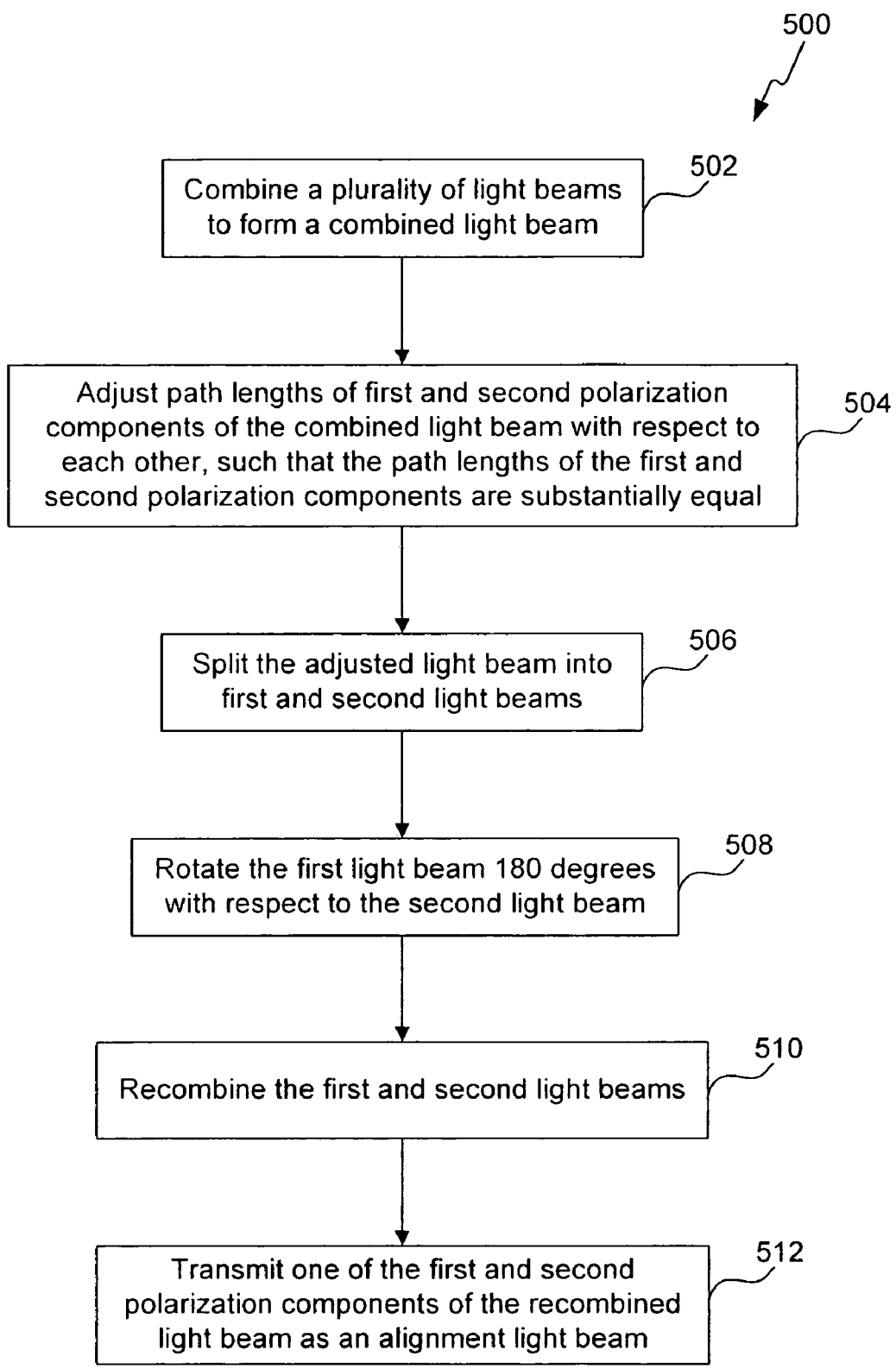
FIG. 5 is a flowchart depicting a method, according to one embodiment of the present invention.

FIG. 5 is a flowchart depicting a method 500, according to one embodiment of the present invention. Method 500 can be performed, for example, using one of the embodiments discussed above, for example in relation to FIGS. 3 and 4.

In step 502, a plurality of light beams are combined to form a combined light beam. Alternatively, as discussed above, a single light beam can be used without departing from the scope of the present invention. The following description will be in terms of an example using a combined light beam. In step 504, path lengths of first and second polarization components of the combined light beam are adjusted with respect to each other, such that the path lengths of the first and second polarization components are substantially equal. In step 506, the adjusted light beam is split into first and second light beams. In step 508, the first light beam is rotated 180 degrees with respect to the second light beam. In step 510, the first and second light beams are recombined. In step 512, one polarization component of the recombined light beam is transmitted to be used as alignment illumination.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A system for producing an adjusted light beam prior to an interaction between the adjusted light beam and a substrate, comprising:
    an interferometer configured to receive a light beam, the light beam produced from a light source or from combining beams from a plurality of light sources, to split the received light beam into first and second beams, to rotate the first beam with respect to the second beam about an axis of rotation, such that, when recombined, the first and second beams have 180 degree symmetry about the axis of rotation, and to recombine the first and second beams to form the recombined beam;
    a compensator configured to adjust path lengths of either the combined light beam or the recombined beam in first and second polarization directions to form the adjusted light beam, such that the path lengths in each of the first and second polarization directions are substantially equal; and
    an analyzer configured to pass a polarization direction or an amplitude and phase profile of the recombined light beam or a polarization direction or an amplitude and phase profile of the adjusted light beam, wherein the adjusted light beam is directed onto the substrate.

2. The system of claim 1, further comprising:
    a spatial filter configured to filter the light beam before the light beam is received by the interferometer.

3. The system of claim 1, wherein the compensator comprises a Soleil Babinet compensator.

4. The system of claim 1, wherein the interferometer comprises:
    a beam splitter configured to receive and to split the light beam into the first and second beams;
    a first prism configured to rotate the first beam positive 90 degrees; and
    a second prism configured to rotate the second beam negative 90 degrees,
    wherein the beam splitter is configured to form the recombined beam after the first and second beams are rotated by respective ones of the first and second prisms 180 degrees with respect to each other.

5. The system of claim 4, wherein the beam splitter comprises a polarizing beam splitter.

6. The system of claim 1, wherein the recombined beam comprises a 180 degree symmetry in phase and amplitude.

7. The system of claim 1, further comprising:
    an alignment mark on the substrate; and
    a detection system,
    wherein a beam output from the analyzer is configured to reflect from the alignment mark and to be received by the detection system, which is configured to use the reflected beam to align the substrate.

8. The system of claim 1, wherein the analyzer comprises a polarizing beam splitter.

9. The system of claim 1, further comprising:
    a combiner configured to receive the two or more beams from the corresponding light sources and to form the combined light beam.

10. A system for producing a recombined light beam prior to an interaction between the recombined light beam and a substrate, comprising:
    a spatial light filter configured to filter a light beam, the light beam produced from a light source or from a combiner configured to combine beams from a plurality of light sources;
    a compensation device configured to adjust path lengths of the filtered light in first and second polarization directions, such that the path lengths are substantially equal;
    an interferometer configured to split the compensated light into first and second beams, to rotate the first beam 180 degrees with respect to the second beam, and to recombine the first and second beams to form the recombined beam; and
    an analyzer configured to pass a polarization direction or an amplitude and phase profile of the recombined beam, wherein the recombined beam is directed onto the substrate.

11. The system of claim 10, wherein the compensation device comprises a Soleil Babinet compensator.

12. The system of claim 10, wherein the interferometer comprises:
    a beam splitter configured to receive and to split the combined light beam into the first and second beams;
    a first prism configured to rotate the first beam positive 90 degrees; and
    a second prism configured to rotate the second beam negative 90 degrees,
    wherein the beam splitter is configured to form the recombined beam after the first and second beams are rotated by respective ones of the first and second prisms 180 degrees with respect to each other.

13. The system of claim 12, wherein the beam splitter comprises a polarizing beam splitter.

14. The system of claim 10, wherein the analyzer comprises a polarizing beam splitter.

15. A method for producing an alignment light beam prior to an interaction between the alignment light beam and a substrate, comprising:
    producing a light beam from a light source or from combining beams from a plurality of light sources;
    adjusting path lengths of first and second polarization components of the light beam with respect to each other, such that the path lengths of the first and second polarization components are substantially equal;
    splitting the adjusted light beam into first and second light beams;
    rotating the first light beam 180 degrees with respect to the second light beam;
    recombining the first and second light beams to form the recombined light beam; and
    transmitting one of the first and second polarization components or one of a first or second amplitude and phase profile of the recombined light beam as an alignment light beam, wherein the alignment beam is directed onto the substrate.

16. A lithography apparatus, comprising:

an illumination system configured to provide a beam of illumination;

a patterning device configured to pattern the beam;

a projection system configured to project the patterned beam onto a substrate; and an alignment system configured to align the substrate before it receives the patterned light, the alignment system comprising:

an alignment illumination system for producing a light beam prior to an interaction between the light beam and a substrate and configured to produce the light beam from a light source or from combining beams from a plurality of light sources, a spatial filter, a compensator, a 180 degree rotational interferometer, an analyzer, and a detection system.

17. The lithography apparatus of claim 16, wherein the compensator comprises a Soleil Babinet compensator.

18. The lithography apparatus of claim 16, wherein the 180 degree rotational interferometer comprises:

a beam splitter;

a first prism; and a second prism.

19. The lithography apparatus of claim 18, wherein the beam splitter comprises a polarizing beam splitter.

20. The lithography apparatus of claim 16, wherein the analyzer comprises a polarizing beam splitter.

* * * * *